US009881859B2

(12) United States Patent
We et al.

(10) Patent No.: US 9,881,859 B2
(45) Date of Patent: Jan. 30, 2018

(54) SUBSTRATE BLOCK FOR POP PACKAGE (71) Applicant: QUALCOMM Incorporated, San Diego, CA (US)

(72) Inventors: Hong Bok We, San Diego, CA (US);
Dong Wook Kim, San Diego, CA (US);
Jae Sik Lee, San Diego, CA (US);
Shiqun Gu, San Diego, CA (US);
Ratibor Radojcic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/273,882

(22) Filed: May 9, 2014

(65) Prior Publication Data
US 2015/0325509 A1 Nov. 12, 2015

(51) Int. Cl.
*H01L 23/498* (2006.01)
*H01L 23/538* (2006.01)
(Continued)

(52) U.S. Cl.
CPC .. *H01L 23/49827* (2013.01); *H01L 21/31127* (2013.01); *H01L 21/565* (2013.01);
(Continued)

(58) Field of Classification Search
CPC ............ H01L 21/486; H01L 21/76898; H01L 21/4857; H01L 23/055; H01L 21/76802; H01L 24/80; H01L 24/01; H01L 21/565; H01L 21/78; H01L 23/3107; H01L 23/498; H01L 23/49866; H01L 23/5226; H01L 23/528; H01L 24/97; H01L 25/0657; H01L 25/105; H01L 25/50; H01L 24/49827; H01L 24/3128; H01L 25/0655; H01L 2224/16235; H01L 2224/97; H01L 2225/06513; H01L 2225/06517; H01L 2225/06548; H05K 1/09; H05K 1/115
See application file for complete search history.

(56) References Cited

U.S. PATENT DOCUMENTS 5,426,563 A 6/1995 Moresco et al.
6,014,313 A 1/2000 Hesselbom
(Continued)

FOREIGN PATENT DOCUMENTS

KR 20130132163 A 12/2013
WO WO-2013176426 A1 11/2013

OTHER PUBLICATIONS

International Search Report and Written Opinion—PCT/US2015/029280—ISA/EPO—dated Aug. 18, 2015.

*Primary Examiner* — William F Kraig
*Assistant Examiner* — Khatib Rahman
(74) *Attorney, Agent, or Firm* — Loza & Loza, LLP/Qualcomm (57) ABSTRACT

A substrate block is provided that has an increased width. The substrate block comprises two substrate bars, and the substrate bars each comprise a substrate and a plurality of filled vias through the substrate. The substrate block may be used to manufacture package substrates, and these package substrate may be incorporated into a PoP structure. The package substrate includes a carrier having a plurality of vertical interconnections and a bar coupled to the vertical interconnections.

25 Claims, 9 Drawing Sheets

(51) Int. Cl.
  *H01L 23/522* (2006.01)
  *H01L 21/78* (2006.01)
  *H01L 21/56* (2006.01)
  *H01L 23/31* (2006.01)
  *H01L 25/065* (2006.01)
  *H01L 23/528* (2006.01)
  *H01L 21/311* (2006.01)
  *H05K 1/09* (2006.01)
  *H05K 1/11* (2006.01)
  *H01L 25/10* (2006.01)
  *H01L 25/00* (2006.01)
  *H01L 23/00* (2006.01)

(52) U.S. Cl.
  CPC .......... *H01L 21/78* (2013.01); *H01L 23/3107* (2013.01); *H01L 23/498* (2013.01); *H01L 23/49866* (2013.01); *H01L 23/528* (2013.01); *H01L 23/5226* (2013.01); *H01L 23/5385* (2013.01); *H01L 24/97* (2013.01); *H01L 25/0657* (2013.01); *H01L 25/105* (2013.01); *H01L 25/50* (2013.01); *H05K 1/09* (2013.01); *H05K 1/115* (2013.01); *H01L 21/561* (2013.01); *H01L 23/3128* (2013.01); *H01L 24/13* (2013.01); *H01L 24/16* (2013.01); *H01L 24/81* (2013.01); *H01L 25/0655* (2013.01); *H01L 2224/131* (2013.01); *H01L 2224/13111* (2013.01); *H01L 2224/13113* (2013.01); *H01L 2224/13116* (2013.01); *H01L 2224/13118* (2013.01); *H01L 2224/13139* (2013.01); *H01L 2224/13144* (2013.01); *H01L 2224/13147* (2013.01); *H01L 2224/16235* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81466* (2013.01); *H01L 2224/81484* (2013.01); *H01L 2224/81801* (2013.01); *H01L 2224/81815* (2013.01); *H01L 2224/97* (2013.01); *H01L 2225/06513* (2013.01); *H01L 2225/06517* (2013.01); *H01L 2225/06548* (2013.01); *H01L 2225/107* (2013.01); *H01L 2225/1023* (2013.01); *H01L 2225/1041* (2013.01); *H01L 2225/1058* (2013.01); *H01L 2924/01014* (2013.01); *H01L 2924/01029* (2013.01); *H01L 2924/141* (2013.01); *H01L 2924/143* (2013.01); *H01L 2924/1433* (2013.01); *H01L 2924/157* (2013.01); *H01L 2924/1579* (2013.01); *H01L 2924/15311* (2013.01); *H01L 2924/15331* (2013.01); *H01L 2924/15788* (2013.01); *H01L 2924/20648* (2013.01); *H01L 2924/3511* (2013.01); *H05K 2201/09563* (2013.01)

(56) References Cited

U.S. PATENT DOCUMENTS

| | | |
|---|---|---|
| 8,507,927 B2 | 8/2013 | Iida et al. |
| 8,987,868 B1* | 3/2015 | Rahman ................. 257/621 |
| 2004/0043536 A1 | 3/2004 | Hong et al. |
| 2010/0327419 A1 | 12/2010 | Muthukumar et al. |
| 2011/0140268 A1* | 6/2011 | Cheah et al. ............. 257/737 |
| 2013/0161836 A1* | 6/2013 | Yeom ................. H01L 21/563 |
| | | 257/778 |
| 2013/0168856 A1* | 7/2013 | Wang et al. ............. 257/738 |
| 2014/0035935 A1 | 2/2014 | Shenoy et al. |
| 2014/0048906 A1 | 2/2014 | Shim et al. |
| 2014/0217604 A1* | 8/2014 | Chou et al. .............. 257/774 |
| 2014/0312481 A1* | 10/2014 | Choi ..................... H01L 25/50 |
| | | 257/686 |
| 2015/0187742 A1 | 7/2015 | Kwon et al. |

* cited by examiner

FIG. 7 though these specific embodiments disclosed herein

SUBSTRATE BLOCK FOR POP PACKAGE

TECHNICAL FIELD

This application relates to integrated circuit packaging, and more particularly, to a substrate block used in the manufacture of a package substrate that provides improved handling and assembly.

BACKGROUND

Ongoing demand for smaller electronic devices has pressured manufacturers of such devices to increase the component density and reduce the component size wherever possible within the device. To consolidate and conserve circuit board real estate, semiconductor packages may be vertically stacked to form a package-on-package (PoP) structure. A PoP structure is formed by stacking a top package on a bottom package. Electrical connections must be made between the top and bottom packages. For example, interconnections such as solder balls, copper pillars, and copper posts may be used. This typically means that the PoP structure needs additional processes or materials to form the top to bottom connection.

One way to provide this connection is through use of a substrate bar. The substrate bar is a device made separately from the top and bottom packages, and that couples the top and bottom packages in the PoP stack.

Figure 1:
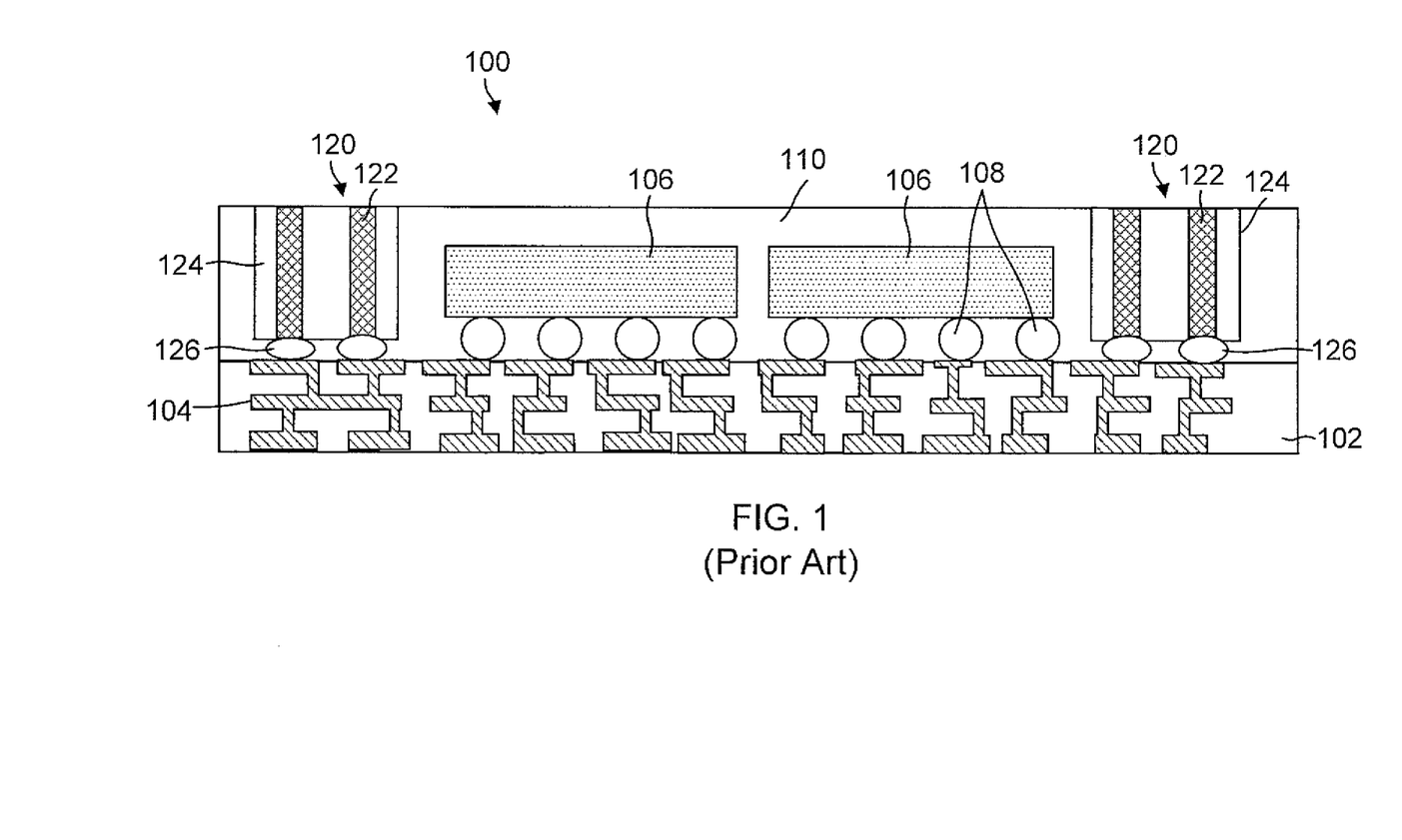
FIG. 1 is a cross-sectional view of a package substrate in accordance with the prior art.

FIG. 1 is a cross-sectional view of a package substrate 100 in the prior art. The package substrate 100 of the prior art includes a carrier substrate 102 that includes a plurality of metal layers 104. A plurality of dies 106 and substrate bars 120 are mounted to carrier substrate 102. The substrate bars 120 include filled vias 122 surrounded by a substrate material 124. Filled vias 122 may be used to route electrical signals through the package substrate 100 to an external circuit. The dies 106 are electrically and mechanically connected to carrier substrate 102 through interconnections 108 (e.g., bumps). The substrate bars 120 are electrically and mechanically connected to carrier substrate 102 through interconnections 126 (e.g., bumps). A molding compound or encapsulant 110 is deposited over the dies 106 and the substrate bars 120. Lateral edges of the substrate bars 120 are not exposed. The sides of the substrate bars 120 are instead surrounded by molding compound 110.

During manufacture of the package substrate 100, the substrate bars 120 are positioned next to each of the dies 106, and then molding compound 110 is deposited over the dies 106 and bars 120. Because typical substrate bars 120 are both thin and long, the bars 120 are easily broken and hard to handle. Moreover, it is difficult to place the substrate bars 120 in an accurate position on the carrier substrate 102.

Accordingly, there is a need in the art for substrate bars that are stronger and more easily handled and assembled.

SUMMARY

Various features of the present disclosure relate to a substrate block and its use in the manufacture of a package substrate. The substrate block is wider than traditional substrate bars and is easier to handle and assemble. The package substrate may be incorporated in a PoP structure.

In one aspect, the present disclosure relates to a device that includes a carrier that includes a plurality of vertical interconnections, and a bar coupled to the vertical interconnections. The bar includes a substrate and a plurality of filled vias through the substrate.

In a second aspect, the present disclosure relates to a package substrate that includes a carrier, and a bar and a die coupled to the carrier. The bar includes a plurality of filled vias that extend from one bar surface to a second bar surface. The bar also extends laterally to a lateral edge of the carrier so as to exposed on at least one side.

In a third aspect, the present disclosure relates to a method that includes mounting a die and substrate block on a carrier and depositing a molding compound over the die and substrate block. The substrate block includes two bars and at least one bar includes a plurality of filled vias. The method further includes singulating the substrate block and carrier between the two bars so that at least one side of the bar is exposed.

In a fourth aspect, the present disclosure relates to a device that includes a carrier, and a bar and a die coupled to the carrier. The bar includes means for providing electrical connections between one bar surface and a second opposing bar surface. The bar also extends laterally to a lateral edge of the carrier so as to be exposed on at least one side.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures. The figures are not to scale.

DETAILED DESCRIPTION

To meet the need in the art for stronger substrate bars, a substrate block is provided that is wider, and therefore easier to handle and position on, for example, a carrier. The substrate block includes a substrate and a plurality of filled vias through the substrate. The substrate, in various embodiments, includes silicon, glass, or an organic material. The substrate block includes two bars that can be separated during the manufacture of a package substrate.

In the following description, specific details are set forth describing some embodiments of the present disclosure. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the present disclosure. Various mechanical, compositional, structural, and operational changes may be made without departing from the spirit and scope of this description and the claims. In some instances, well-known structures and techniques have not been shown or described in detail in order not to obscure the present disclosure.

Further, this description's terminology is not intended to limit the present disclosure. For example, spatially relative terms—such as "beneath", "below", "lower", "above", "upper", "top", "bottom", and the like—may be used to describe one element's or feature's relationship to another element or feature as illustrated in the figures. These spatially relative terms are intended to encompass different positions (i.e., locations) and orientations (i.e., rotational placements) of a device in use or operation in addition to the position and orientation shown in the figures. For example, if a device in the figures is turned over, elements described as "below" or "beneath" other elements or features would then be "above" or "over" the other elements or features. Thus, the exemplary term "below" can encompass both positions and orientations of above and below. A device may be otherwise oriented (rotated 90 degrees or at other orientations) and the spatially relative descriptors used herein interpreted accordingly.

Overview

Figure 2:
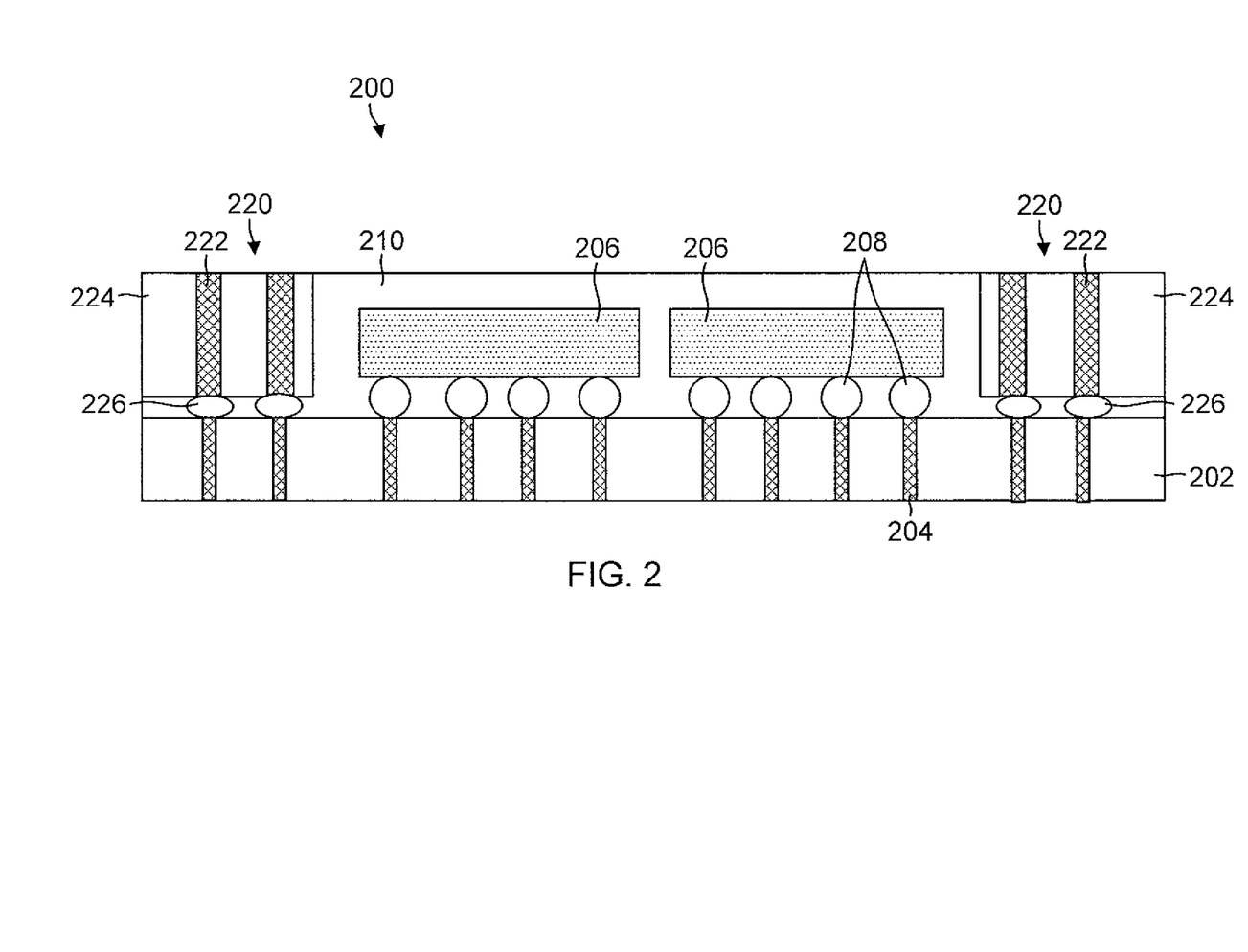
FIG. 2 is a cross-sectional view of a package substrate in accordance with an embodiment of the present disclosure.

Turning now to the drawings, FIG. 2 shows an example package substrate 200 that includes a carrier substrate 202, dies 206, and substrate bars or bars 220. In some embodiments, the carrier substrate 202 includes silicon. In some aspects, the carrier substrate 202 prevents warping of the package substrate 200. The carrier substrate 202 includes a plurality of vertical interconnections 204. The vertical interconnections 204 may include aluminum, copper, tin, nickel, gold, silver, titanium, tungsten, or other suitable electrically conductive material. The vertical interconnections 202 route signals between the dies 206 and motherboards, printed circuit boards (PCB) or other substrates that place the package substrate 200 in communication with other system components.

The vertical interconnections 204 may be formed in the carrier substrate 202 using electrolytic plating, electroless plating, or other suitable metal deposition processes to form vertical interconnections 204. In some embodiments, through substrate vias (TSV) are formed in the carrier substrate 202. TSVs may be formed by laser drilling, plasma etching, or wet etching. The TSVs may extend a fraction or the entire depth of the carrier substrate 202. Once the TSVs are formed, an electrically conductive material is deposited in the TSVs using an evaporation, electrolytic plating, electroless plating, or screen printing process. The conductive material can be aluminum, copper, tin, nickel, gold, or silver.

As shown, dies 206 are mounted and coupled onto carrier substrate 202 with a flip chip style packaging. The dies 206 may contain analog or digital circuits implemented as active devices, passive devices, conductive layers, and dielectric layers formed according to the electrical design of the dies 206. For example, the circuit can include one or more transistors, diodes, inductors, capacitors, resistors, and other circuit elements. The dies 206 are electrically and mechanically connected to carrier substrate 202 through interconnections 208 (e.g., solder bumps or copper pillars). Interconnections 208 may be made of a general solder material. Solder material can be any metal or electrically conductive material, such as tin, lead, gold, silver, copper, zinc, bismuth, and alloys thereof.

Substrate bars 220 are also mounted onto carrier substrate 202. Substrate bars 220 include filled vias 222 surrounded by a substrate material 224. In various embodiments, the substrate material 224 includes a material such as silicon, organic material, or glass. Filled vias 222 extend through the substrate bar 220, providing conductive pathways between opposing faces or surfaces. Filled vias 222 are a means for providing electrical connections between one surface of the substrate bar 220 and a second opposing surface of the substrate bar 220. In various embodiments, the filled vias 222 include one or more of aluminum, copper, tin, nickel, gold, silver, titanium, tungsten, or other suitable electrically conductive material. The filled vias 222 are electrically and mechanically connected to carrier substrate 202 through interconnections 226 (e.g., solder bumps or copper pillars). Interconnections 226 may be made of a general solder material. Solder material can be any metal or electrically conductive material, such as tin, lead, gold, silver, copper, zinc, bismuth, and alloys thereof.

A molding compound or encapsulant 210 is deposited over dies 206 and substrate bars 220 to provide physical support and electrical isolation for the package substrate 200. The molding compound is used to fill gaps in between the dies 206 and the edges around the dies 206 and substrate bars 220. The molding compound 210 can be a polymer composite material, such as epoxy resin with filler, epoxy acrylate with filler, or polymer with proper filler. The molding compound 210 is non-conductive and environmentally protects the dies 206 from external elements and contaminants.

As shown, the lateral edge of each substrate bar 220 is aligned with a lateral edge of the carrier substrate 202. The substrate bars 220 each extend longitudinally along the lateral edge of the carrier substrate 202. In other words, each bar 220 has a width that extends up to the lateral edge of the carrier substrate 202. In various embodiments, the width of the substrate bar 220 is about 500 to 1000 µm, the length of the substrate bar 220 is about 6000 to 9000 µm, and the thickness of the substrate bar 220 is about 80 to 130 µm.

In contrast to the traditional implementation shown in FIG. 1, the widths of each substrate bar 220 extends all the way to the lateral edge of the carrier substrate 202. At least one lateral edge of each of the substrate bars 220 is exposed. Such an alignment of the side of the bar 220 is quite advantageous as the substrate block (discussed below) is relatively wide and thus provides ease of handling and positioning onto the carrier substrate 202. After singulation of the substrate block, however, the substrate bars 220 are relatively narrow and quite compact as they are aligned with the side of the carrier substrate 202.

Advantageously, the carrier substrate 202 and its vertical interconnections 204 may be pre-fabricated and stored. When the package substrate 200 is ready to be manufactured, the dies 206 and substrate bars 220 are simply coupled to the vertical interconnections 204, the molding compound 210 deposited, the molding compound 210 grinded to reveal the contact pads, and the carrier substrate 202 singulated. The process may be used to manufacture thin die assemblies, which results in a total package thickness that is less than traditional packages. The process is simple, efficient, and inexpensive.

Traditional methods, however, involve more steps, materials, and different processes. Typically, the dies and substrate bars are first attached to a temporary carrier that does not include interconnections. Molding compound is then deposited over the dies and substrate bars. Next, the dies and substrate bars (collectively the molded wafer) are separated from the temporary carrier, and the temporary carrier removed. The molded wafer must then be attached to a carrier again. A redistribution layer (RDL) must then be formed to provide electrical connections to the substrate bars. The RDL is constructed from scratch. That is, none of its components are pre-made. Forming the RDL can include seed layer sputtering, photoresist coating, exposure, developing, metal plating, stripping, and etching. Many process steps are needed. The whole process takes longer because the RDL is formed in real-time. Moreover, the process is more expensive because it is more complicated and involves more steps.

Package on Package Embodiment

Figure 3:
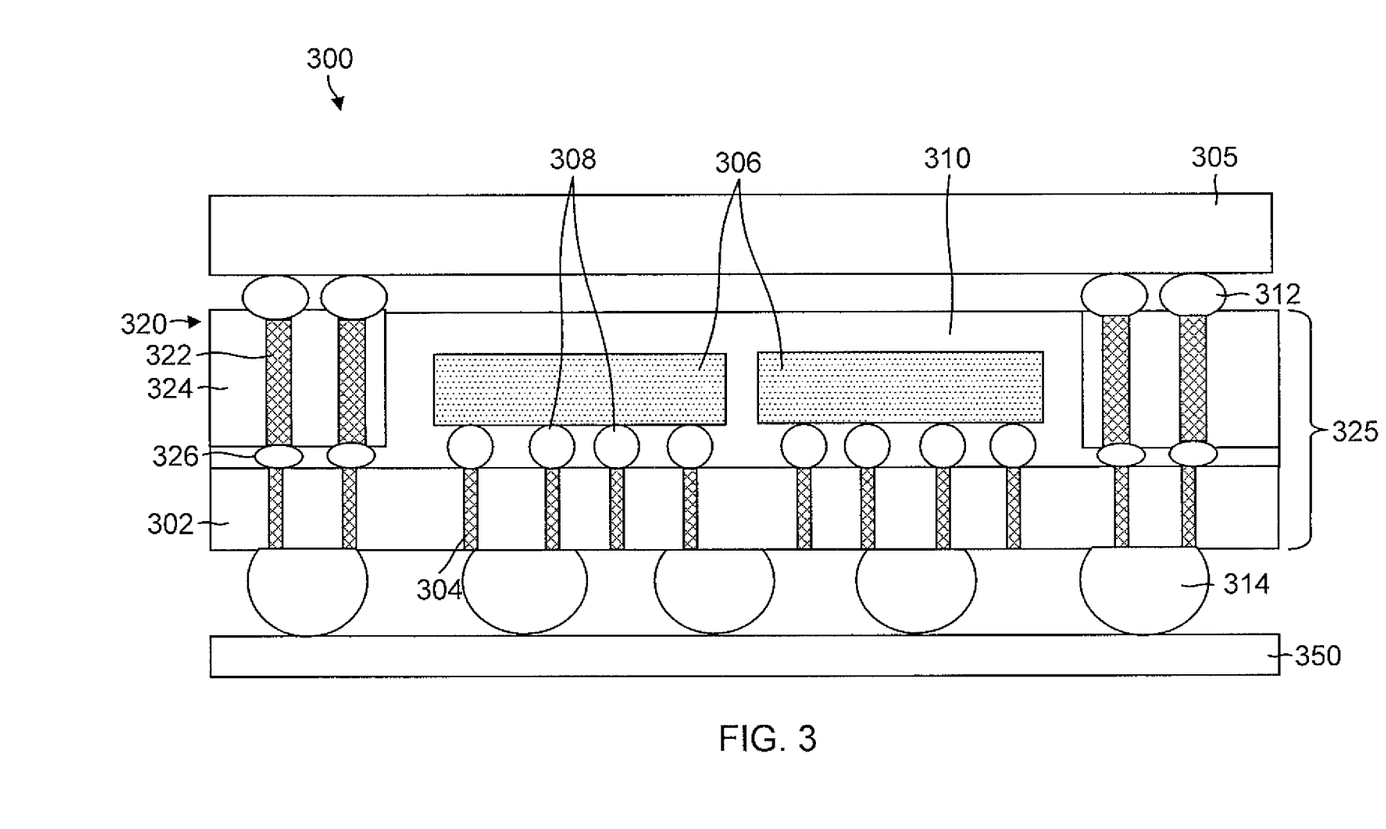
FIG. 3 is a PoP package includes a package substrate in accordance with an embodiment of the present disclosure.

FIG. 3 illustrates a PoP structure 300 in accordance with one or more embodiments of the present disclosure. The PoP 300 includes a first package substrate 325 vertically integrated with a second package substrate 305. The PoP 300 is mounted on an electronic device printed circuit board (PCB) 350 via interconnections 314.

The first package substrate 325 (e.g., bottom package substrate) is shown including a carrier substrate 302 with a plurality of vertical interconnections 304. A plurality of dies 306 and substrate bars 320 are mounted to carrier substrate 302. The substrate bars 320 include filled vias 322 surrounded by a substrate material 324. The dies 306 are electrically and mechanically connected to carrier substrate 302 through interconnections 308 (e.g., solder bumps or copper pillars). Filled vias 322 provide an electrical connection to the bumps 312, which connect the first package substrate 325 to the second package substrate 305. The substrate bars 320 are electrically and mechanically connected to carrier substrate 302 through interconnections 326 (e.g., solder bumps or copper pillars). A molding compound or encapsulant 310 is deposited over the dies 306 and the substrate bars 320. At least one lateral side of each of the substrate bars 320 is exposed.

It is conventional in the PoP arts that the first package substrate 325 includes a high performance processor such as a base-band processor, an application processor, or other types of application specific integrated circuits (ASICs). Such an integrated circuit typically requires numerous input and output signals that typically require a flip-chip mounting such that the completed first package substrate 325 is analogous to a flip-chip ball-grid array (BGA) circuit.

The second package substrate 305 is typically a memory package, which does not require the input/output density that a processor in the first package substrate 325 would. The second package substrate 305 is electrically and mechanically connected to the first package substrate 325 through solder bumps 312 as known in the flip-chip manufacturing arts. Alternatively bumps 312 may be replaced by copper pillars or other suitable interconnects. More generally, second package substrate 305 includes a means for conductively interconnecting the second package substrate 305 to the first package substrate 325 such as through the use of bumps 312 (e.g., solder bumps or copper pillars). The bumps 312 are aligned with and coupled to filled vias 322 of the substrate bars 320.

Substrate Block

Figure 4A:
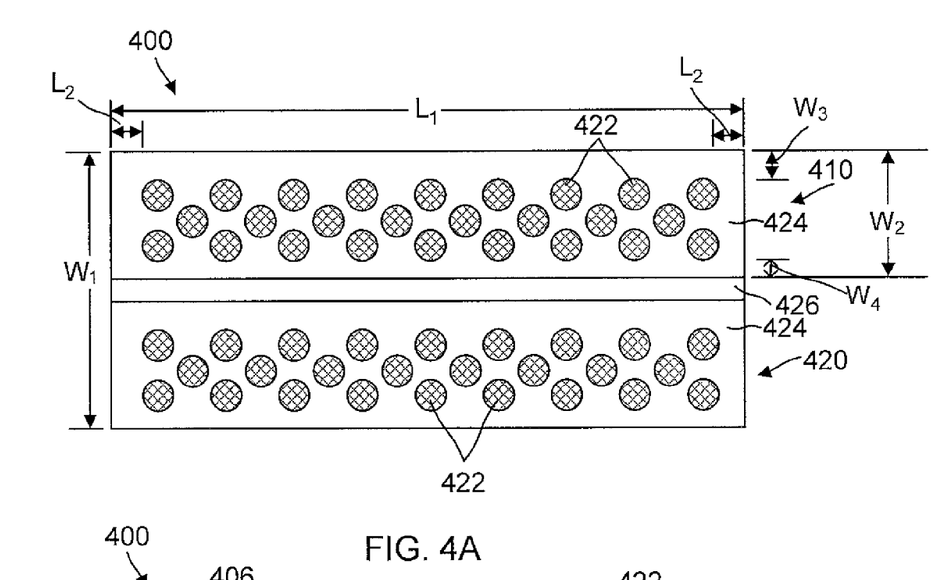
FIG. 4A is a plan view of a substrate block in accordance with an embodiment of the present disclosure.
Figure 4B:
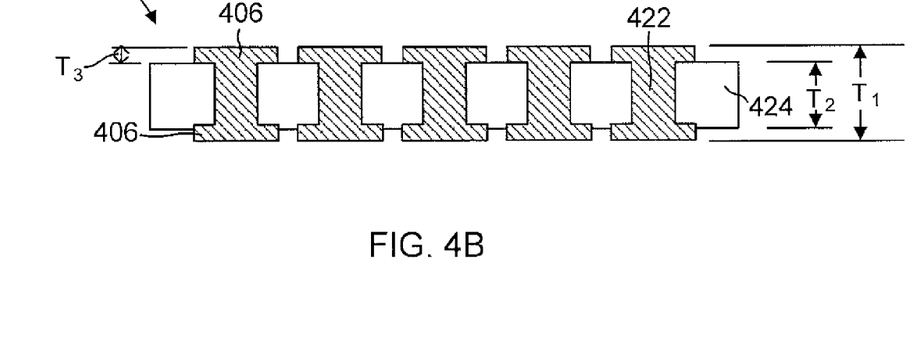
FIG. 4B is a cross-sectional view of a substrate block in accordance with an embodiment of the present disclosure.

FIG. 4A illustrates a plan view of an exemplary substrate block 400. FIG. 4B illustrates a cross-sectional view of substrate block 400. The substrate block 400 has a width $W_1$ that is wider than substrate bars used in traditional implementations, making it easier to handle and less likely to break. The greater width also facilitates accurate placement of the substrate block 400 on another substrate or carrier. In various embodiments, the width $W_1$ of the substrate block 400 is about 1650 μm, its length $L_1$ is about 8000 μm, and its thickness $T_1$ is about 100 μm. It should be understood that the specific dimensions of the substrate block 400 depend on design, and that the specific dimensions discussed herein are merely exemplary.

The substrate block 400 includes two substrate bars 410 and 420 that form a single unit 400. In some embodiments, the substrate bars 410 and 420 each have a width $W_2$ of about 800 μm. The substrate bars 410 and 420 are separated by a space 426 that denotes where the substrate block 400 will be subsequently cut and separated. The substrate bars 410 and 420, in some embodiments, each include filled vias 422 formed in a substrate 424. In various embodiments, the substrate 424 has a thickness $T_2$ that is about 60 μm. The filled vias 422 are spaced a length $L_2$ from an edge of the substrate block 400 and spaced a width $W_3$ from another edge of the substrate block 400. In some embodiments, the distances $L_2$ and $W_3$ are about 200 μm. The filled vias 422 are further spaced a width $W_4$ from the space 426. The width $W_4$ can be about 200 μm. The substrate 424 is formed from conventional substrate materials such as silicon, organic material, or glass. The filled vias 422 extend from one surface (e.g., top surface) of the substrate 402 to a second surface (e.g., bottom surface) of the substrate 402. Filled vias 422 may be formed from any suitable electrically conductive material, such as metal or metal alloys (e.g., copper). Contact pads 406 are formed on the first and second surfaces of the substrate 424, and couple to the filled vias 422. Contact pads 406 may be formed using conventional metal patterning techniques, such as those that include lithography patterning and etching processes. Contact pads 406 have a thickness $T_3$ that, in some embodiments, is at least 15 μm.

In various embodiments, patterns or arrangements of the filled vias 422 are formed in the substrate 424. In some embodiments, the via pattern on substrate bar 410 is the same or similar to the via pattern on substrate bar 420. In another embodiment, the via pattern on substrate bar 410 is different from the via pattern on substrate bar 420. In yet another embodiment, substrate bar 410 does not include a via pattern, while substrate bar 420 includes a via pattern, or vice versa. This provides flexibility in the via patterns used in the manufacture of substrate block 400, and flexibility in package design.

The substrate block 400 may be manufactured using conventional methods. For example, openings for the filled vias 422 may be formed through the substrate 424 using etching, laser drilling, mechanical drilling, deep reactive ion etching, or other conventional methods. In an embodiment, TSVs are formed in the substrate 424. An electrically conductive material is then deposited in the openings using an evaporation, electrolytic plating, electroless plating, or screen printing process. Lastly, contact pads 406 are formed and configured to couple to the filled vias 422.

Example Methods of Manufacture

FIG. 5A through FIG. 5F illustrate manufacturing steps for forming a package substrate, such as the package substrate of FIG. 2, using a substrate block, such as the substrate block of FIG. 4.

Figure 5A:
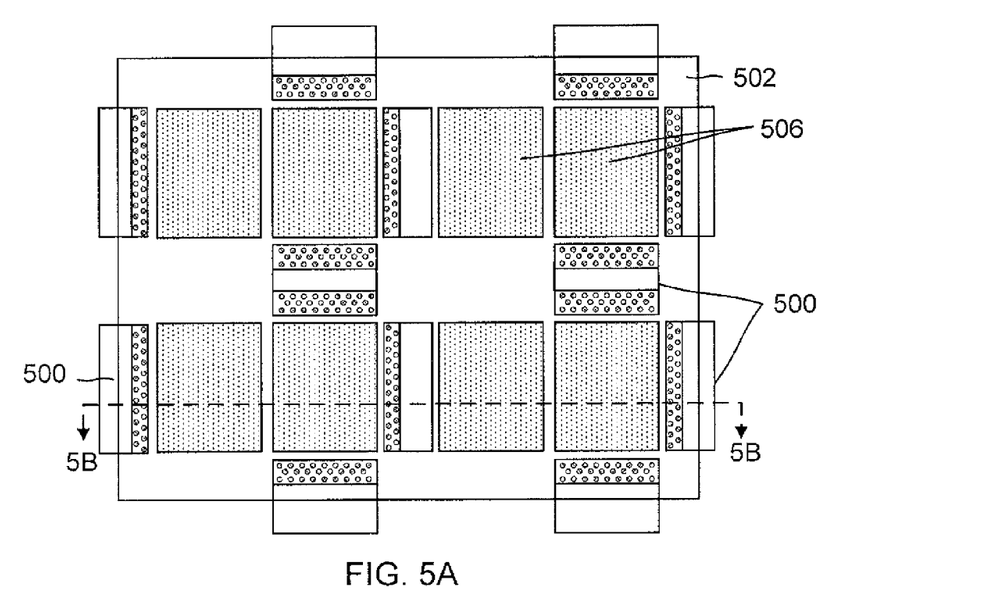
FIGS. 5A and 5C are plan views of a sequence for manufacturing a package substrate in accordance with an embodiment of the present disclosure.
Figure 5B:
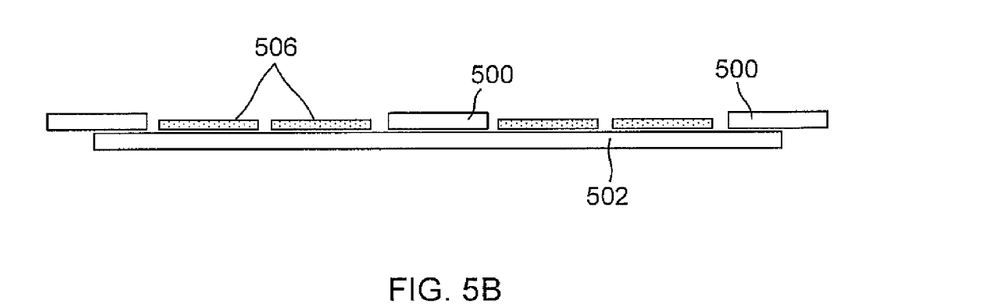
FIGS. 5B, 5D, 5E, and 5F are cross-sectional views of a sequence of manufacturing a package substrate in accordance with an embodiment of the present disclosure.

First, as shown in FIGS. 5A and 5B, a carrier substrate 502 is provided. FIG. 5A is a plan view and FIG. 5B is a cross-sectional view taken along the line 5B. Dies 506 and substrate blocks 500 are mounted and coupled to the carrier substrate 502. For example, dies 506 and substrate blocks 500 are coupled to the carrier substrate 502 through interconnections (e.g., interconnections 308 and 326 in FIG. 3). In an embodiment, thermal conductive bonding is used to couple the dies 506 and/or substrate blocks 500 to the carrier substrate 502. In another embodiment, a reflow soldering process is used to couple the dies 506 and/or substrate blocks 500 to the carrier substrate 502.

The substrate blocks 500 are placed proximate to and disposed along any number of sides of the dies 506. Advantageously, the substrate blocks 500 may be placed in the areas between the dies 506, which are typically keep out zones or space that cannot be used. The ability to use this space leads to smaller packages than those attained in traditional implementations because the carrier substrate 502 can be divided in the areas where the substrate blocks 500 are placed.

Figure 5C:
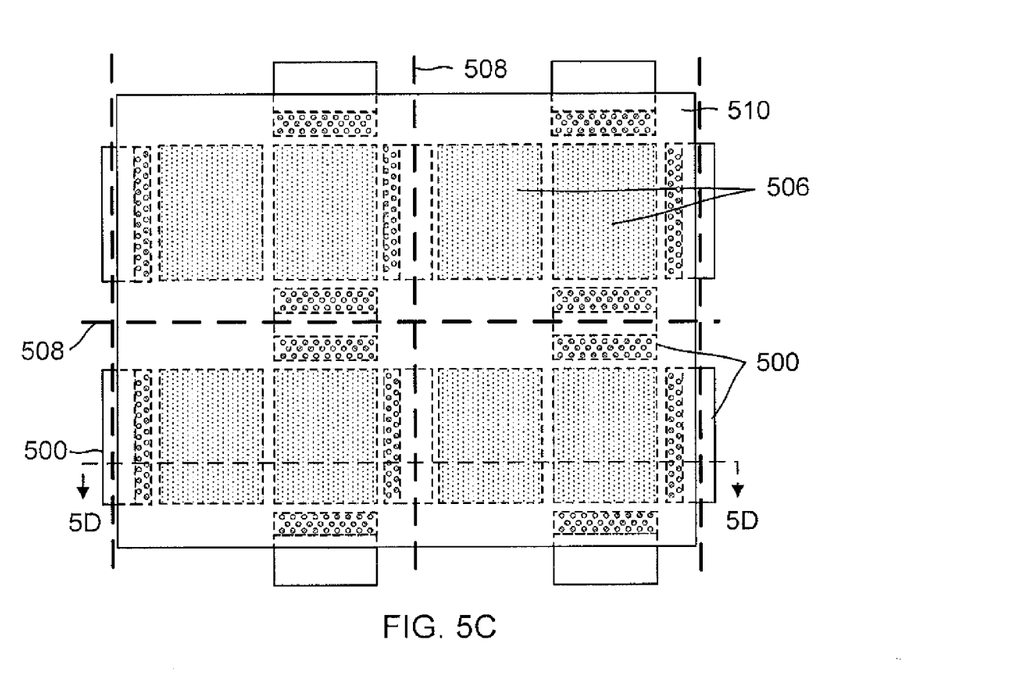
Figure 5D:
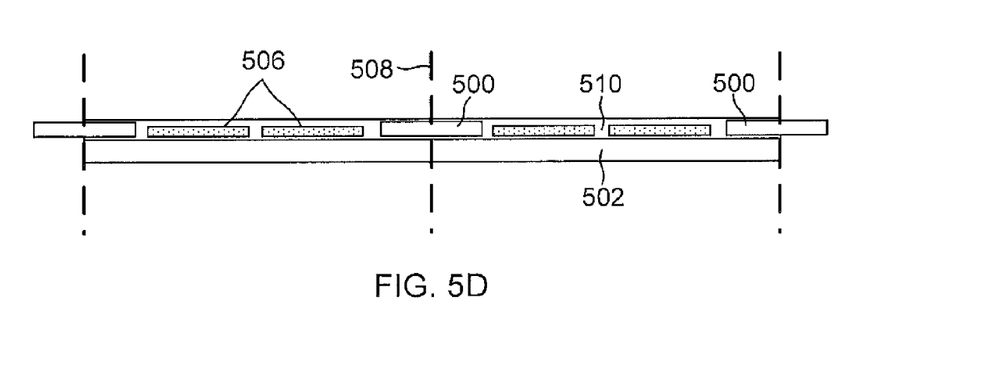

In FIGS. 5C and 5D, a molding compound or encapsulant 510 is deposited over the carrier substrate 502, dies 506 and substrate blocks 500 using, for example, a paste printing, compressive molding, transfer molding, liquid encapsulant molding, vacuum lamination, spin coating, or other suitable applicator. FIG. 5C is a plan view and FIG. 5D is a cross-sectional view taken along the line 5D. Molding compound 510 can be polymer composite material, such as epoxy resin with filler, epoxy acrylate with filler, or polymer with proper filler. Molding compound 510 is non-conductive and environmentally protects the dies 506 and substrate blocks 500 from external elements and contaminants. In various embodiments, grinding is used to planarize and thin the molding compound 510 to expose at least the contact pads of the substrate block 500. In certain embodiments, the contact pads may be too big for an interconnection, and the area of the contact pad exposed can be easily modified by the grinding process. In some embodiments, the molding compound 510 is not present at all on the top surfaces of the substrate blocks 500. Advantageously, the top surfaces of the filled vias 522 are exposed to make it easier to couple a substrate bar to other devices or structures.

Saw or singulation lines 508 are also formed to indicate where the carrier substrate 502 and substrate blocks 500 are to be cut and separated. As shown, saw lines 508 are formed in between substrate bars of the substrate blocks 500.

Figure 5E:
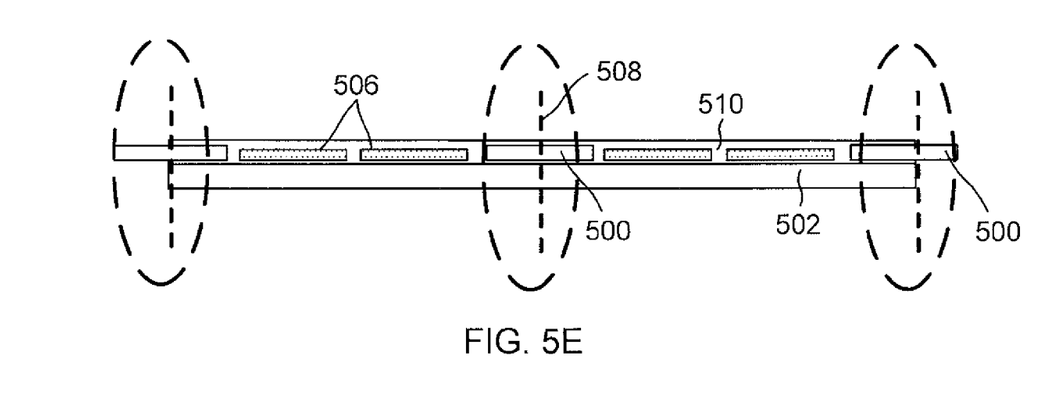

FIG. 5E illustrates the singulation of the carrier substrate 502 and the substrate blocks 500 along saw or singulation lines 508. The saw lines 508 separate the substrate blocks 500 into two substrate bars.

Figure 5F:
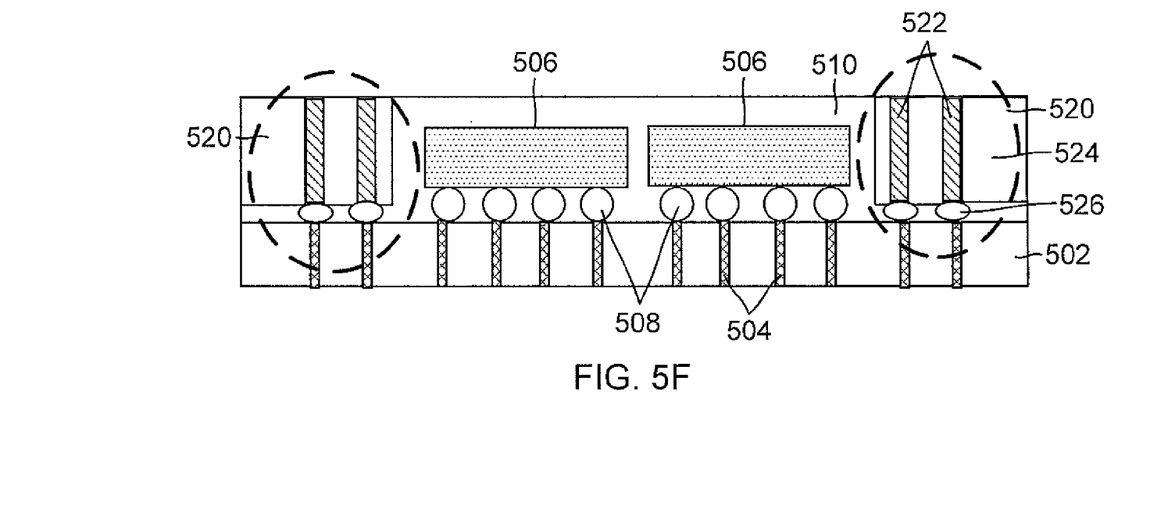

FIG. 5F illustrates a separated package substrate obtained after the singulation in FIG. 5E. After singulation, at least one side of the substrate bars 520 is completely exposed. The substrate block 500 is relatively wide and provides ease of handling and positioning on the carrier substrate 502. When the substrate block 500 is cut and singulated into the substrate bars 520, however, the substrate bars 520 are relatively narrow and quite compact as they are aligned with the side of the carrier substrate 502.

Method of Manufacturing Flowchart

Figure 6:
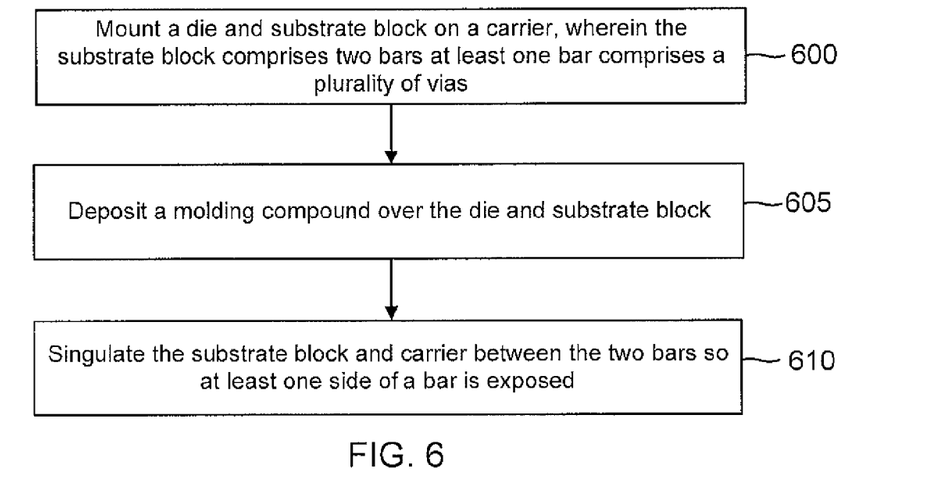
FIG. 6 is a flowchart for a method of manufacture for a package substrate in accordance with an embodiment of the present disclosure.

A manufacturing process generic to the various embodiments discussed herein may be summarized as shown in a flowchart of FIG. 6. A first step 600 includes mounting a die and substrate block on a carrier, wherein the substrate block includes two bars and at least one bar includes a plurality of filled vias. This step is illustrated, for example, in FIGS. 5A-5B. A second step 605 includes depositing a molding compound over the die and substrate block. An example of this step is shown in FIGS. 5C and 5D. A third step 610 includes singulating the substrate block and the carrier in between the two bars so that at least one side of the bar is completely exposed. This step is illustrated, for example, in FIGS. 5E and 5F.

Example Electronic Systems

Figure 7:
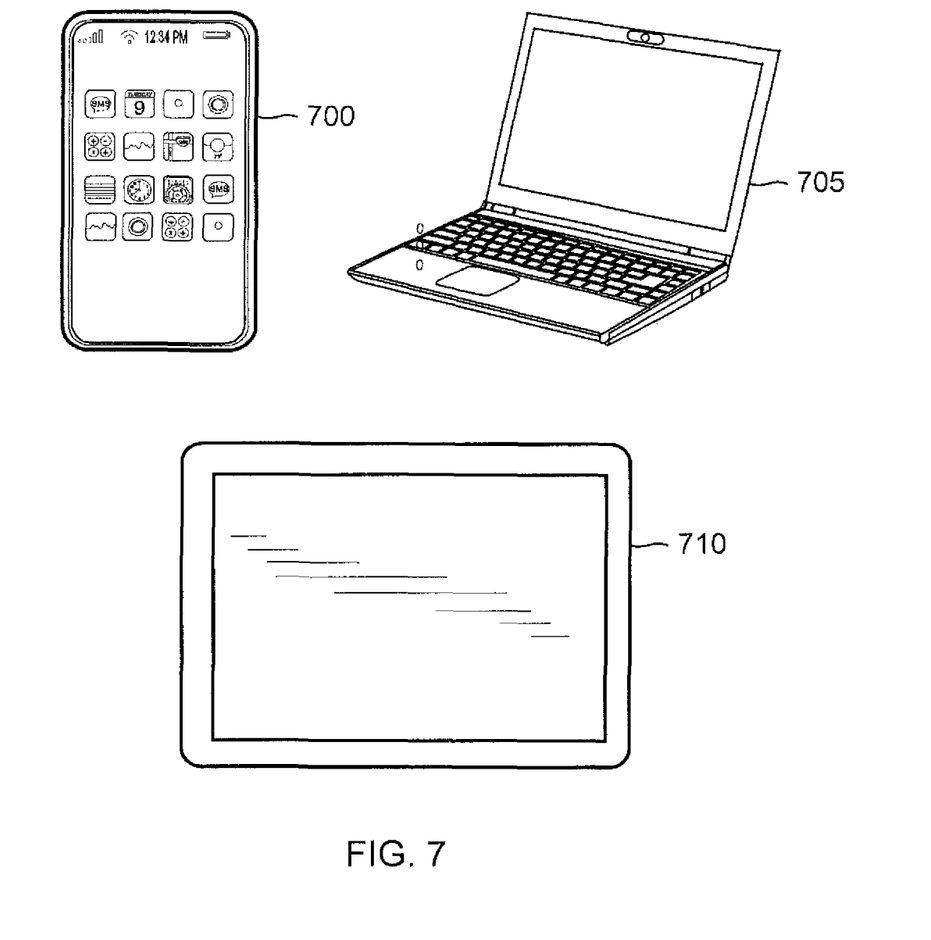
FIG. 7 illustrates some example electronic systems incorporating a package substrate in accordance with an embodiment of the present disclosure.

A PoP structure including a package substrate as disclosed herein may be incorporated into a wide variety of electronic systems. For example, as shown in FIG. 7, a cell phone 700, a laptop 705, and a tablet PC 710 may all include an PoP package incorporating a package substrate constructed in accordance with the disclosure. Other exemplary electronic systems such as a music player, a video player, a communication device, and a personal computer may also be configured with integrated circuit packages constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A device comprising: a die comprising a first die surface and a second die surface, wherein the first die surface is on an opposite side to the second die surface; a carrier comprising a plurality of vertical interconnections; a first bar coupled to the vertical interconnections, wherein the first bar has a first bar width and comprises a substrate and a plurality of filled vias through the substrate, and wherein the first bar width extends to and aligns with a lateral edge of the carrier, and wherein the first bar is adjacent to the first die surface; a second bar separate from the first bar, the second bar having a second bar width and coupled to the vertical interconnections and comprising an additional substrate, and wherein the second bar width extends to and aligns with the lateral edge of the carrier, and wherein the second bar is adjacent to the second die surface; and an encapsulant, wherein the die, the first bar and the second bar are embedded in the encapsulant, wherein the first bar has a via pattern and the second bar is devoid of a via pattern.

2. The device of claim 1, wherein the substrate comprises silicon, organic material, or glass.

3. The device of claim 1, further comprising contact pads on first and second surfaces of the substrate.

4. The device of claim 1, wherein the first bar is exposed on at least one side.

5. The device of claim 4, wherein a lateral side of the first bar is exposed.

6. The device of claim 4, wherein a side of the first bar perpendicular to the plurality of filled vias is exposed.

7. The device of claim 1, wherein the filled vias comprise copper.

8. A package substrate, comprising:
a carrier comprising a plurality of vertical interconnections;
a first bar coupled to the vertical interconnections, the first bar having a first bar width and comprising a plurality of filled vias surrounded by a substrate material, wherein the first bar width extends to and aligns with a lateral edge of the carrier, and wherein the plurality of filled vias extend from one bar surface to a second bar surface;

a die comprising a first die surface and a second die surface, wherein the first die surface is on an opposite side to the second die surface, and wherein the die is coupled to the vertical interconnections and the first bar is adjacent to the first die surface;

a second bar separate from the first bar and the die, the second bar having a second bar width and coupled to the vertical interconnections, and a plurality of additional filled vias and wherein the second bar width extends to and aligns with the lateral edge of the carrier, and wherein the second bar is adjacent to the second die surface; and wherein the first bar extends laterally to align with a lateral edge of the carrier so as to be exposed on at least one side; and an encapsulant, wherein the die, the first bar and the second bar are embedded in the encapsulant, wherein the plurality of the filled vias of the first bar are arranged in a first via pattern and the plurality of additional filled vias of the second bar are arranged in a second via pattern different than the first via pattern.

9. The package substrate of claim 8, wherein the carrier comprises silicon.

10. The package substrate of claim 8, wherein the first bar width is about 800 μm.

11. The package substrate of claim 8, wherein the substrate material comprises silicon, organic material, or glass.

12. The package substrate of claim 8, further comprising a molding compound that covers the die and is disposed in between the first bar and the die.

13. The package substrate of claim 8, included in a package on package (PoP) structure.

14. The PoP structure of claim 13, further comprising a second package substrate coupled to the package substrate through an interconnection.

15. The PoP structure of claim 13, wherein the plurality of filled vias and vertical interconnections are configured to route signals through the package substrate.

16. The PoP structure of claim 13, wherein the PoP structure is incorporated into at least one of a cellphone, a laptop, a tablet, a music player, a communication device, a computer, and a video player.

17. A device, comprising:

a carrier comprising a plurality of vertical interconnections;

a first bar coupled to the vertical interconnections, the first bar having a first bar length and a first bar width and comprising means for providing electrical connections between one bar surface and a second opposing bar surface;

a die comprising a first die surface and a second die surface, wherein the first die surface is on an opposite side to the second die surface, and wherein the die is coupled to the vertical interconnections and the first bar is adjacent to the first die surface;

a second bar separate from the first bar and the die, the second bar coupled to the vertical interconnections, and wherein the second bar is adjacent to the second die surface and wherein the first bar width extends laterally to align with a lateral edge of the carrier so as to be exposed on at least one side; and an encapsulant, wherein the die, the first bar and the second bar are embedded in the encapsulant, wherein the die comprises a top surface and a bottom surface and opposed edge surfaces extending between the top surface and the bottom surface and between the first die surface and the second die surface, and the first bar length extends to align with at least one of the opposed edge surfaces of the die.

18. The device of claim 17, wherein the means comprises a plurality of filled vias coupled to the vertical interconnections.

19. The device of claim 17, wherein the first bar width is about 800 μm.

20. The device of claim 17, further comprising a molding compound that covers the die and is disposed in between the first bar and the die.

21. The device of claim 17, wherein the device is included in a package on package (PoP) structure.

22. The device of claim 1, wherein the second bar comprises an additional lateral edge that aligns with an additional lateral edge of the carrier.

23. The device of claim 1, wherein the second bar comprises an additional lateral edge that aligns with the lateral edge of the carrier.

24. The device of claim 1, wherein the second bar is exposed on at least one side.

25. The device of claim 1, wherein the second bar is exposed on at least one side.

* * * * *